United States Patent [19]
Wholey et al.

[11] Patent Number: 5,436,595
[45] Date of Patent: Jul. 25, 1995

[54] LOW VOLTAGE BIPOLAR AMPLIFIER

[75] Inventors: James Wholey, Saratoga; Kevin Negus, Palo Alto, both of Calif.

[73] Assignee: Hewlett-Packard Company, Palo Alto, Calif.

[21] Appl. No.: 283,877

[22] Filed: Aug. 1, 1994

[51] Int. Cl.⁶ .............................................. H03F 3/04
[52] U.S. Cl. ..................................... 330/296; 330/261
[58] Field of Search ................. 330/256, 261, 289, 296

[56] References Cited
U.S. PATENT DOCUMENTS

| | | | |
|---|---|---|---|
| 3,896,394 | 7/1975 | Baro | 330/289 |
| 4,207,537 | 6/1980 | Cave et al. | 330/253 |
| 4,274,061 | 6/1981 | Kraemer | 330/296 |
| 4,575,685 | 3/1986 | Dobkin et al. | 330/296 X |
| 5,150,076 | 9/1992 | Asazawa | 330/296 |

Primary Examiner—James B. Mullins
Attorney, Agent, or Firm—Jonathan B. Penn; Patrick J. Barrett

[57] ABSTRACT

A bipolar transistor amplifier with improved base biasing is disclosed. In the bias circuit of the present invention, the bias current only varies with the log(log) of variations in $\beta$ of the NPN transistors, making the circuit particularly resistant to temperature and process induced variations in $\beta$. A feedback loop also insures that the bias current will remain constant under normal operating conditions. In several embodiments of the present invention, the bias signal and the input signal are kept separate, reducing interference. The amplifier and bias circuit provides a large amount of voltage headroom even with low supply voltages.

10 Claims, 5 Drawing Sheets

LOW VOLTAGE BIPOLAR AMPLIFIER

BACKGROUND OF THE INVENTION

The present invention is generally in the field of bipolar transistor circuits. In particular, it is in the field of biasing methods and circuits for bipolar transistor amplifiers.

The need to bias transistors for proper circuit operation is known, as are methods and circuits for providing the necessary bias voltages and currents. Known methods and circuits include emitter, base, and collector biasing. Each method and circuit has certain advantages, but no known method is without significant disadvantages. A single emitter bias circuit is shown in FIG. 1. A fixed voltage $V_{Ref}$ is applied to the base of transistor 13, turning it on. In turn, a current $I_{c1}$ flows through transistor 11. Although the circuit is easy to make and allows for the accurate determination of $I_{c1}$, it is very inefficient. The collector voltage swing available for transistor 11 is limited largely by $V_{Ref}$. This collector voltage swing over the amplifier is herein referenced as the voltage headroom of the amplifier.

Collector biasing, shown in FIG. 2, has the important advantage of coupling transistor 25's emitter to ground, which provides more voltage headroom for the amplifier. The disadvantages result from having resistor 21 coupled between $V_{cc}$, the emitter of transistor 23, and the collector of transistor 25. This creates a load impedance on transistor 25 which is not always desirable and restricts the available voltage headroom. Load impedance and bias conditions which are coupled limit the subsequent options for tuning the amplifier and varying its efficiency. The biasing network is closely coupled to the circuit's input and output and the output signal can flow back through the bias network and cause the circuit to oscillate. Additional capacitance may be needed in the feedback pathway to prevent such oscillation. Despite this, collector biasing is useful in low noise amplifiers, as there is no resistive impedance on the emitter to add noise.

A first base biasing circuit is shown in FIG. 3. The current through resistor 31, $I_{set}$, is roughly equal to $V_{cc}-C_{be}$ (the base-emitter voltage drop of a transistor) divided by the combination of resistors 31 and 37. Proper sizing of resistor 39 and transistor 35 results in the current through transistor 35's collector, $I_{c2}$, having a value of $10I_{set}$. The voltage headroom can be as large as in the collector biasing circuit shown in FIG. 2 or larger, as the voltage at transistor 35's emitter is low (~200 millivolts). The circuit functions equally well in linear and non-linear amplifiers and has adequate first order temperature compensation as the $V_{be}$ of all the NPN transistors varies roughly equally with variations in temperature. As the circuit's input impedance is difficult to tune, it tends to perform poorly in monolithic integrated circuit ("IC") applications. The circuit is not compensated for variations in $\beta$, which can vary by a factor of 2 to 3 times from wafer to wafer. Temperature induced $\beta$ variations also affect the circuit's bias point and performance. Additionally, short of disconnecting or otherwise turning off $V_{cc}$, there is no simple way of powering down the circuit.

A second base biasing circuit is shown in FIG. 4. $I_{Set2}$ equals $V_{Ref}-V_{be}$ divided by resistor 47. Through the principle of current mirroring and the use of proper component values, $I_{c3}$ equals five times $I_{Set}$ and $I_{c4}$ is equal to four times $I_{c3}$. In this circuit, $V_{Ref}$ is supplied by a band gap reference voltage source which is independent of supply voltage $V_{cc}$ and is temperature compensated. The circuit as a whole is fully temperature compensated and the NPN transistors are more independent of $\beta$ variations. The input impedance of this circuit is greater than that of the circuit shown in FIG. 3. Turning off the circuit shown in FIG. 4 is easily done by turning off the band gap reference voltage source. The circuit has the major disadvantage that the input signal and the bias signal are coupled together. $I_{c3}$ modulates with the input and resistor 42 feeds back to transistor 50 through PNP transistor 44. The feedback signal distorts the input signal and can lead to oscillation. The bias circuit also requires a relatively high $V_{cc}$, as the voltage drops over resistors 42 and 45 are large in order to isolate the bias current and signal currents.

There remains a need for a bias circuit which can provide the maximum possible voltage headroom while simultaneously separating the input signal and the bias signal while operating at a low supply voltage. Full temperature compensation and high input impedance are also desirable.

SUMMARY OF THE INVENTION

A first embodiment of the present invention comprises a method and apparatus for biasing a common emitter amplifier, which method and apparatus provides frequency independent operation, temperature and supply voltage compensation and maximizes the voltage headroom available to the amplifier. In several embodiments of the present invention the input signal and bias signal are separated, which minimizes mutual interference. Additionally, the use of a band gap regulator voltage source provides a simple means to turn the bias network and amplifier off.

The present invention will now be described in detail with reference to the figures listed and described below.

DETAILED DESCRIPTION OF THE PREFERRED EMBODIMENTS

Figure 1:
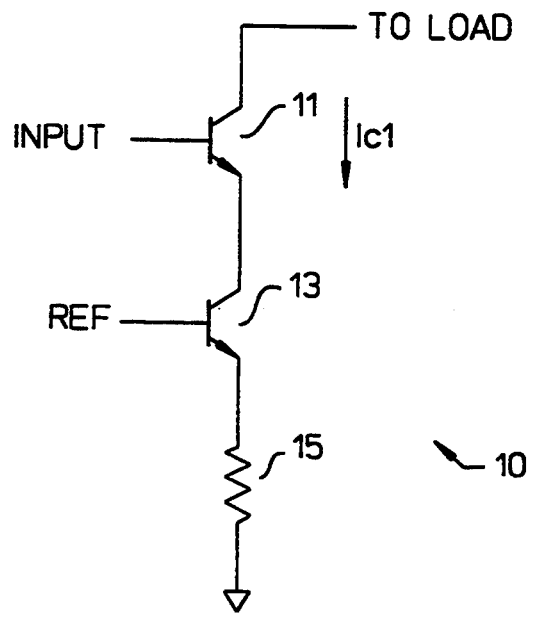
FIG. 1 shows an emitter biasing network(Prior Art)
Figure 2:
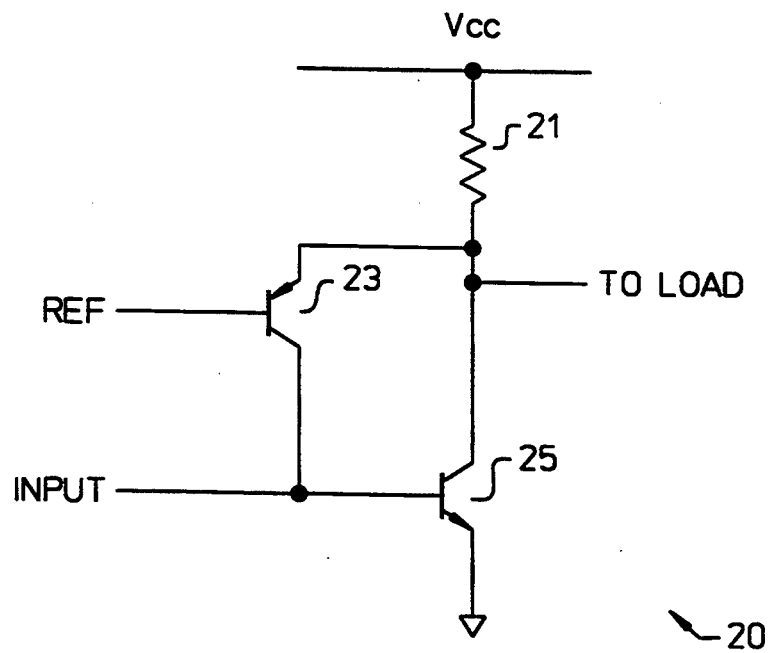
FIG. 2 shows a collector biasing network(Prior Art)
Figure 3:
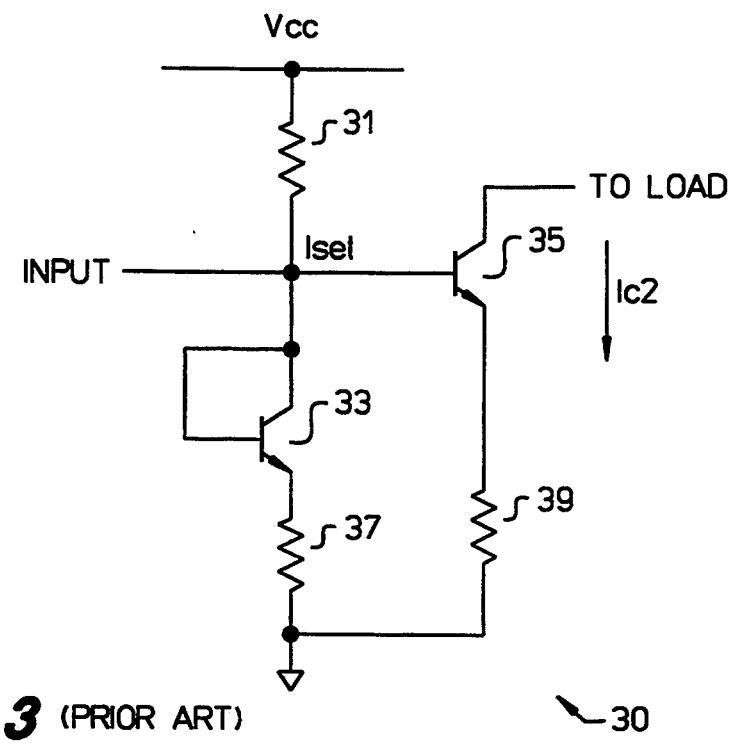
FIG. 3 shows a first base biasing network(Prior Art)
Figure 4:
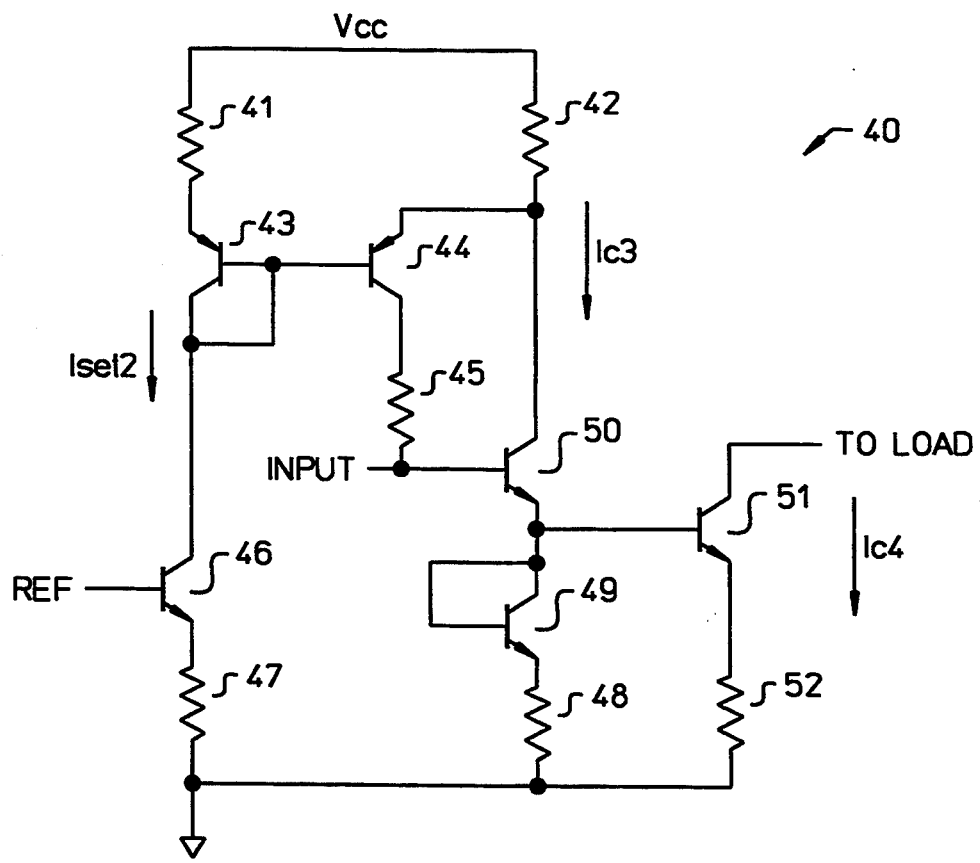
FIG. 4 shows a second base biasing network(Prior Art)
Figure 5:
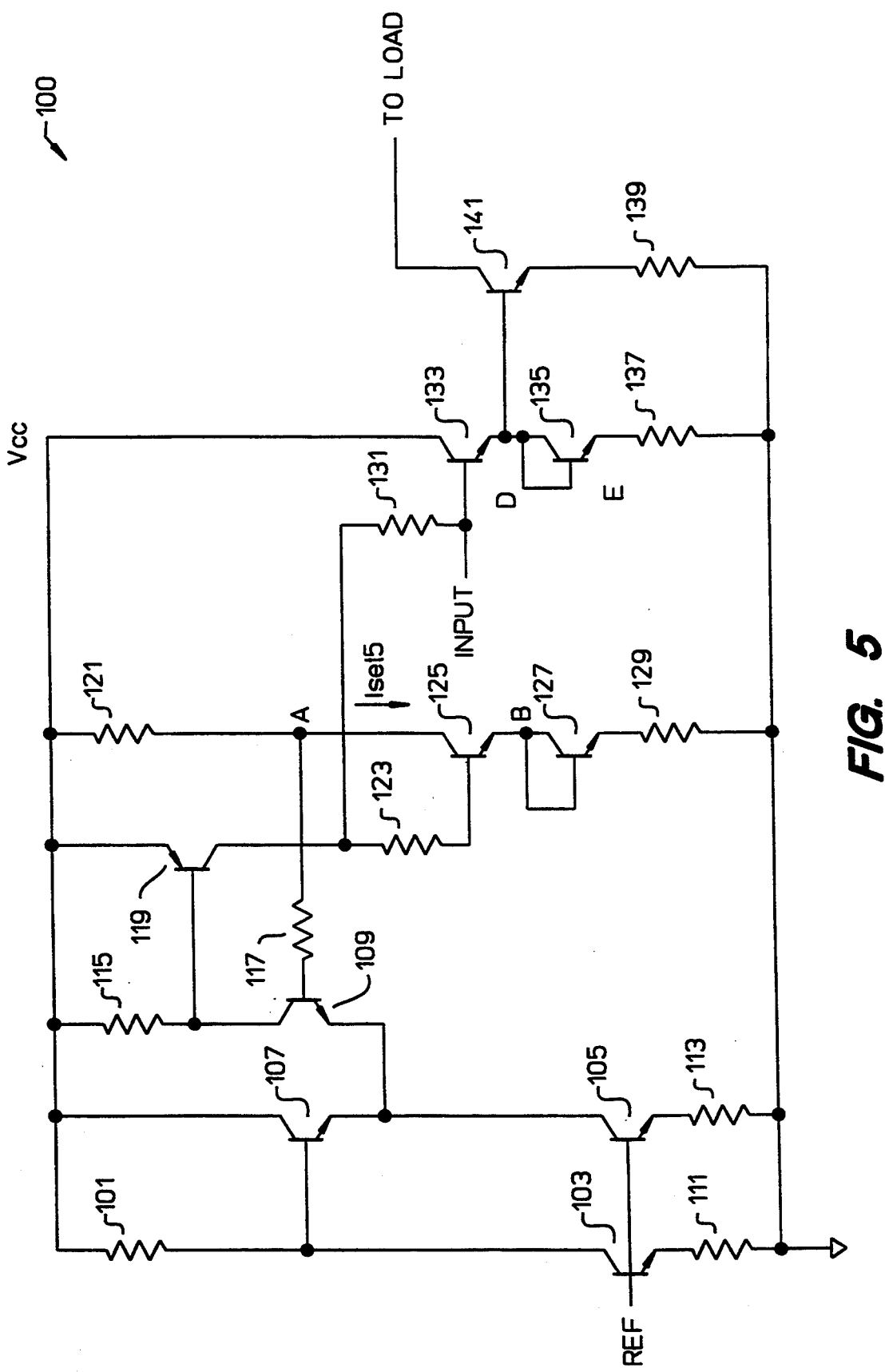
FIG. 5 illustrates a first embodiment of the present invention.

FIG. 5 is a schematic diagram of a first embodiment of the present invention. The RF signal input is AC coupled into emitter-follower transistor 133, which is in turn coupled to output transistor 141. Transistor 141 can be coupled to an on-chip LC output stage for good impedance matching with the load. The tuning stage is not shown and does not form part of the present invention.

The base of transistor 103 is coupled to a band gap reference voltage source generating a voltage $V_{Ref}$. Such band gap reference voltage sources are known and require no description here. The voltage across resistor 111 is consequently $V_{Ref}-V_{be}$, hence $V_1$. A current mirror reflects a voltage $V_{cc}-V_1(R_{101}/R_{111})$ across resistor 101. As the voltage drop across resistor 117 is very small, the voltage at node A is also $V_{cc} - V_1(R_{101}/R_{111})$. The current through node A is $[V_{cc} - V_1(R_{101}/R_{111})]/R_{121}$ and is labelled $T_{Set5}$.

If the voltage at node A drops below the target value, a feedback loop involving transistors 109, 119 and 125 acts to reestablish the desired voltage. If the voltage at node A is too low, the base voltage of transistor 109 is reduced, lowering the collector current of transistor 109. This increases the base voltage on PNP transistor 119, which lowers the collector current of transistor 119. This in turn lowers the base current of transistor 125, causing its collector current to decrease and forcing the voltage at node A to rise to its stable position. When the voltage on node A is too large, the feedback loop operates in exactly the opposite manner than has just been described. In this way, a constant voltage is maintained on node A and $I_{Set5}$ remains constant.

$I_{Set5}$ in turn determines the voltage on nodes B and C in a known manner. These same voltages are generated at nodes D and E on the RF side of the circuit through the proper ratio of transistors 133 and 135 and resistor 137. The circuit techniques required for creating this ratio are known. In this first embodiment, the current through the collector of transistor 133 is four times $I_{Set5}$, and the current through the collector of transistor 141 is sixteen times $I_{Set5}$.

Among the advantages of this embodiment of the present invention are the fact that the RF signal is isolated from the elements of the circuit that comprise the bias network and the fact that the circuit can be turned off by reducing $V_{Ref}$. Also, as the emitter of PNP transistor 119 is coupled to $V_{cc}$, this circuit provides the maximum voltage headroom available.

The present invention also offers both first and second order temperature compensation. First order temperature compensation depends upon the $V_{be}$ of the transistors that comprise the present invention. As they are fabricated together as part of the IC fabrication process, they generally respond in a similar fashion to variations in temperature.

$\beta$ variations resulting from temperature change and process variations are compensated for in the present invention. As the PNP transistors are, in some sense, a consequence of the fabrication process that creates the NPN transistors and not the object of that fabrication process, their specifications are not exact and their $\beta$ can vary widely with respect to the $\beta$ of the NPN transistors. In the present invention, PNP characteristics are effectively irrelevant to the bias current $I_{Set5}$. The base voltage of PNP transistor 119 changes by the log of NPN bipolar transistor 133's and 125's base current. $I_{Set5}$ depends on the log of NPN bipolar transistor 109's collector current, or, stated differently, it varies in log(-log) relation to the $\beta$ of the NPN transistor. This effectively decouples $I_{Set5}$ and thus the amplifier's bias current from variations in $\beta$.

Figure 6:
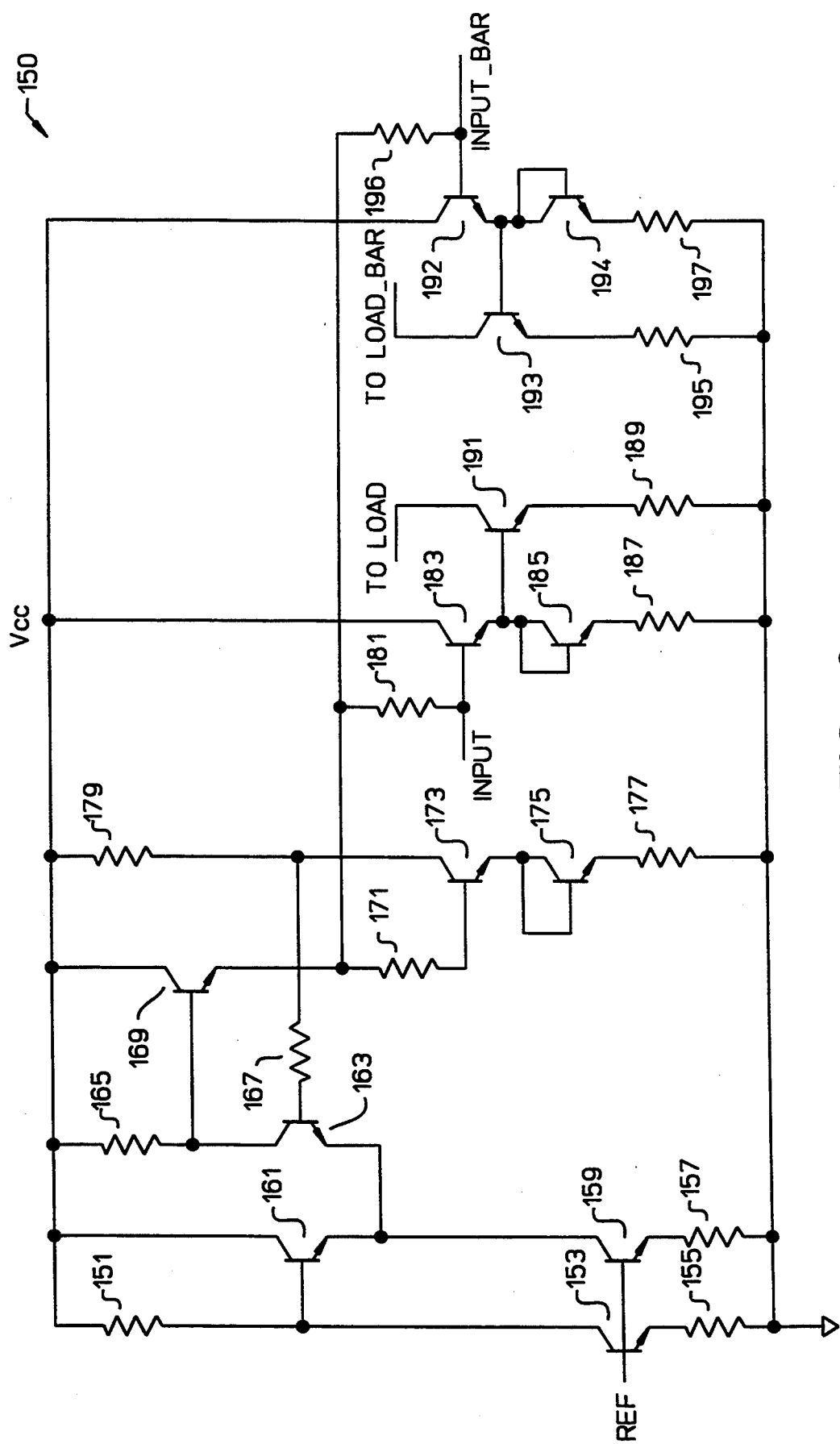
FIG. 6 illustrates a second embodiment of the present invention.

FIG. 6 is a schematic drawing of a second embodiment of the present invention. The biasing circuitry is identical to that shown in FIG. 5 but the RF output section is implemented as a differential output pair of transistors driven with open (untuned) collectors (transistors 191 and 193). The mirrored voltages on transistors 192 and 194 are different from the equivalent voltages in the circuit shown in FIG. 5.

Figure 7:
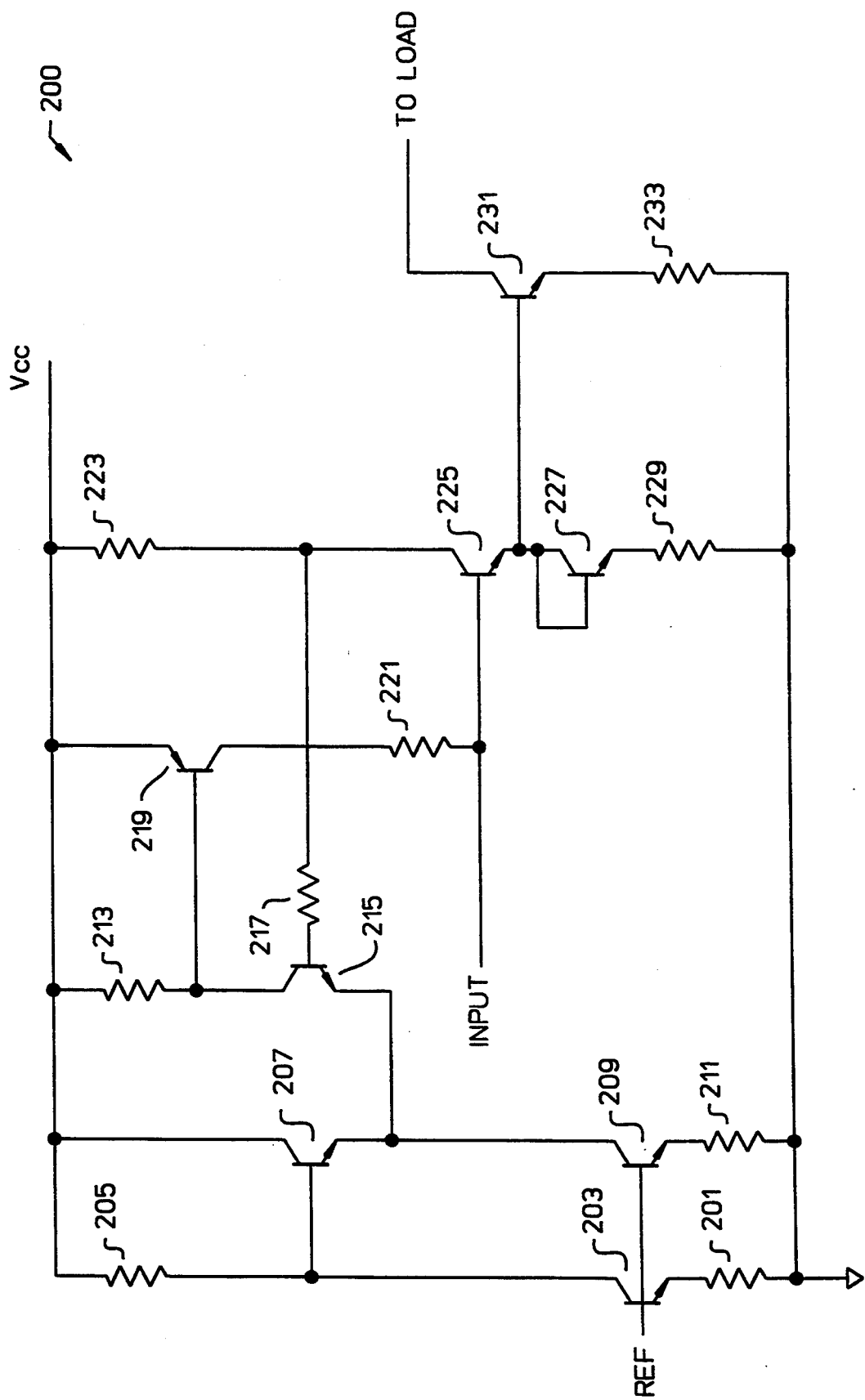
FIG. 7 illustrates a third embodiment of the present invention.

FIG. 7 shows a schematic drawing of another embodiment of the present invention wherein the bias current's signal path is no longer separated from the input signal's current path. Although this can cause distortion in the RF signal, it has the advantage of requiring fewer components and less IC surface arena than other biasing circuits, as well as providing a large headroom voltage. This permits the design of a low $V_{cc}$ amplifier.

We claim:

1. A bias circuit for providing a bias current to an amplifier, the circuit comprising:
   first circuit means for establishing a first predefined voltage;
   feedback circuit coupled to the first circuit means for establishing and maintaining a first predefined current within a predefined range, the first predefined current derived from the first predefined voltage; and
   first ratio circuit coupled to the feedback circuit for establishing a second predefined current, which second predefined current is a multiple of the first predefined current and which second predefined current is the bias current for the amplifier, the bias current generated by the bias circuit and an input signal to the amplifier not mixing within the bias circuit, the bias circuit being coupled to the amplifier through resistors and high impedance collectors of bipolar transistors.

2. The circuit of claim 1 wherein the feedback circuit comprises a first and second NPN bipolar transistor, each NPN bipolar transistor having a first predefined $\beta$ range and a collector, base, and emitter, and a first PNP bipolar transistor, the PNP bipolar transistor having a second predefined $\beta$ range and a collector, base, and emitter, the collector of the first NPN bipolar transistor being coupled to a supply voltage through a first resistor and to the base of the second NPN bipolar transistor through a second resistor, the base of the first NPN bipolar transistor being coupled to the collector of the first PNP bipolar transistor through a fourth resistor, the emitter of the first PNP bipolar transistor being coupled to the supply voltage, the base of the PNP bipolar transistor being coupled to the collector of the second NPN bipolar transistor and through a third resistor to the supply voltage, the emitter of the second NPN bipolar transistor being coupled to the first circuit means and the emitter of the first NPN bipolar transistor being coupled to the first ratio circuit.

3. The circuit of claim 2 wherein the base voltage on the first PNP bipolar transistor varies with the log of both a base current into the amplifier and the base current in the first NPN bipolar transistor, the collector current of the second NPN bipolar transistor varying linearly with the base voltage of the first PNP bipolar transistor, and the bias current varying with the log of the collector current in the second NPN bipolar transistor.

4. The circuit of claim 3 wherein variations in the first predefined $\beta$ range of the first and second NPN bipolar transistors and the second predefined $\beta$ range of the first PNP bipolar transistor do not substantially affect the bias current.

5. A method for providing a bias current to an amplifier, the method comprising the steps of:
   establishing a first predefined voltage;
   establishing and maintaining a first predefined current within a first predefined range by means of feedback, the first predefined current derived from the first predefined voltage;

multiplying the first predefined current by a predefined multiplier to establish a second predefined current, the second predefined current comprising the bias current; and isolating the bias current from signals to the amplifier by means of resistors and high impedance collectors of bipolar transistors.

6. A bipolar transistor amplifier with a bias current comprising:

first NPN transistor with predefined $\beta$ range and a collector, base, and emitter, the emitter coupled to a ground voltage through a first resistor, the base coupled to a reference voltage, and the collector coupled to a supply voltage through a third resistor;

second NPN transistor with predefined $\beta$ range and a collector, base, and emitter, the emitter of the second NPN transistor being coupled to the ground voltage through a second resistor, and the base of the second NPN transistor being coupled to the reference voltage;

third NPN transistor with predefined $\beta$ range and a collector, base, and emitter, the collector of the third NPN transistor being coupled to the supply voltage, the emitter of the third NPN transistor being coupled to the collector of the second NPN transistor, and the base of the third NPN transistor being coupled to the collector of the first NPN transistor;

fourth NPN transistor with predefined $\beta$ range and a collector, base, and emitter, the emitter of the fourth NPN transistor being coupled to the emitter of the third NPN transistor, the base of the fourth NPN transistor being coupled to the supply voltage through a fifth and a seventh resistor, and the collector of the fourth NPN transistor being coupled to the supply voltage through a fourth resistor;

first PNP transistor with predefined $\beta$ range and a collector, base, and emitter, the emitter of the first PNP transistor being coupled to the supply voltage, the base of the first PNP transistor being coupled to the collector of the fourth NPN transistor, and the collector of the first PNP transistor being coupled to an input node through a ninth resistor;

fifth NPN transistor with predefined $\beta$ range and a collector, base, and emitter, the collector of the fifth NPN transistor being coupled to the supply voltage through the seventh resistor and the base of the fifth NPN transistor being coupled to the collector of the first PNP transistor through a sixth resistor;

sixth NPN transistor with predefined $\beta$ range and a collector, base, and emitter, the collector and base of the sixth NPN transistor being coupled to the emitter of the fifth NPN transistor and the emitter of the sixth NPN transistor being coupled to the ground voltage through an eighth resistor;

seventh NPN transistor with predefined $\beta$ range and a collector, base, and emitter, the collector of the seventh NPN transistor being coupled to the supply voltage and the base of the seventh NPN transistor being coupled to the input node;

eighth NPN transistor with predefined $\beta$ range and a collector, base, and emitter, the collector and base of the eighth NPN transistor being coupled to the emitter of the seventh NPN transistor and the emitter of the eighth NPN transistor being coupled to the ground voltage through a tenth resistor; and ninth NPN transistor with predefined $\beta$ range and a collector, base, and emitter, the collector of the ninth NPN transistor being coupled to an output load, the base of the ninth NPN transistor being coupled to the emitter of the seventh NPN and the collector and base of the eight NPN transistor, and the emitter of the ninth NPN transistor being coupled to the ground voltage through an eleventh resistor.

7. The bipolar transistor amplifier of claim 6 wherein the first PNP transistor and the fourth and fifth NPN transistors together function as a feedback circuit which maintains the bias current within a predefined range.

8. The bipolar transistor amplifier of claim 7 wherein the bias current varies with the log of the log of the $\beta$ in the NPN transistors.

9. The circuit of claim 1 wherein the feedback circuit comprises a first and second NPN bipolar transistor, each NPN bipolar transistor having a first predefined $\beta$ range and a collector, base, and emitter, and a first PNP bipolar transistor, the PNP bipolar transistor having a second predefined $\beta$ range and a collector, base, and emitter, the collector of the first NPN bipolar transistor being coupled to a supply voltage through a first resistor and to the base of the second NPN bipolar transistor, the base of the first NPN bipolar transistor being coupled to the collector of the first PNP bipolar transistor through a third resistor, the emitter of the first PNP bipolar transistor being coupled to the supply voltage, the base of the PNP bipolar transistor being coupled to the collector of the second NPN bipolar transistor and through a second resistor to the supply voltage, the emitter of the second NPN bipolar transistor being coupled to the first circuit means and the emitter of the first NPN bipolar transistor being coupled to the first ratio circuit.

10. A bipolar transistor amplifier with a bias current comprising:

first NPN transistor with predefined $\beta$ range and a collector, base, and emitter, the emitter coupled to a ground voltage through a first resistor, the base coupled to a reference voltage, and the collector coupled to a supply voltage through a third resistor;

second NPN transistor with predefined $\beta$ range and a collector, base, and emitter, the emitter of the second NPN transistor being coupled to the ground voltage through a second resistor, and the base of the second NPN transistor being coupled to the reference voltage;

third NPN transistor with predefined $\beta$ range and a collector, base, and emitter, the collector of the third NPN transistor being coupled to the supply voltage, the emitter of the third NPN transistor being coupled to the collector of the second NPN transistor, and the base of the third NPN transistor being coupled to the collector of the first NPN transistor;

fourth NPN transistor with predefined $\beta$ range and a collector, base, and emitter, the emitter of the fourth NPN transistor being coupled to the emitter of the third NPN transistor, the base of the fourth NPN transistor being coupled to the supply voltage through a sixth resistor, and the collector of the fourth NPN transistor being coupled to the supply voltage through a fourth resistor;

first PNP transistor with predefined $\beta$ range and a collector, base, and emitter, the emitter of the first PNP transistor being coupled to the supply voltage, the base of the first PNP transistor being coupled to the collector of the fourth NPN transistor, and the collector of the first PNP transistor being coupled to an input node through a eight resistor;

fifth NPN transistor with predefined $\beta$ range and a collector, base, and emitter, the collector of the fifth NPN transistor being coupled to the supply voltage through the sixth resistor and the base of the fifth NPN transistor being coupled to the collector of the first PNP transistor through a fifth resistor;

sixth NPN transistor with predefined $\beta$ range and a collector, base, and emitter, the collector and base of the sixth NPN transistor being coupled to the emitter of the fifth NPN transistor and the emitter of the sixth NPN transistor being coupled to the ground voltage through an seventh resistor;

seventh NPN transistor with predefined $\beta$ range and a collector, base, and emitter, the collector of the seventh NPN transistor being coupled to the supply voltage and the base of the seventh NPN transistor being coupled to the input node;

eighth NPN transistor with predefined $\beta$ range and a collector, base, and emitter, the collector and base of the eighth NPN transistor being coupled to the emitter of the seventh NPN transistor and the emitter of the eighth NPN transistor being coupled to the ground voltage through a ninth resistor; and ninth NPN transistor with predefined $\beta$ range and a collector, base, and emitter, the collector of the ninth NPN transistor being coupled to an output load, the base of the ninth NPN transistor being coupled to the emitter of the seventh NPN and the collector and base of the eight NPN transistor, and the emitter of the ninth NPN transistor being coupled to the ground voltage through an tenth resistor.

* * * * *